(12) United States Patent
Hsu et al.

(10) Patent No.: US 9,117,760 B2
(45) Date of Patent: Aug. 25, 2015

(54) METHOD AND SYSTEM FOR ENERGIZED AND PRESSURIZED LIQUIDS FOR CLEANING/ETCHING APPLICATIONS IN SEMICONDUCTOR MANUFACTURING

(71) Applicant: Taiwan Semiconductor Manufacturing Co., Ltd., Hsin-Chu (TW)

(72) Inventors: Yu-Yen Hsu, Zhudong Township (TW); Shao-Yen Ku, Jhubei (TW); Chun-Li Chou, Jhubei (TW); Tsai-Pao Su, Donggang Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/753,823

(22) Filed: Jan. 30, 2013

(65) Prior Publication Data
US 2014/0213063 A1 Jul. 31, 2014

(51) Int. Cl.
*B44C 1/22* (2006.01)
*H01L 21/306* (2006.01)
*H01L 21/67* (2006.01)
*H01L 21/02* (2006.01)

(52) U.S. Cl.
CPC .... *H01L 21/30604* (2013.01); *H01L 21/02057* (2013.01); *H01L 21/30608* (2013.01); *H01L 21/6708* (2013.01); *H01L 21/67017* (2013.01); *H01L 21/67051* (2013.01)

(58) Field of Classification Search
CPC ............... H01L 21/02052; H01L 21/6715; H01L 21/3063; H01L 21/306; H01L 21/30604; H01L 21/67017; C23G 3/023
USPC ............. 216/83, 84, 90, 92, 103, 86; 134/1.2, 134/1.3, 22.1, 3, 86, 88, 95.3; 438/745, 756
See application file for complete search history.

(56) References Cited

U.S. PATENT DOCUMENTS

| | | | |
|---|---|---|---|
| 5,562,778 A * | 10/1996 | Koretsky et al. | 134/1 |
| 2002/0062839 A1* | 5/2002 | Verhaverbeke et al. | 134/1.3 |
| 2004/0173238 A1* | 9/2004 | Boyd et al. | 134/1.3 |
| 2005/0121053 A1* | 6/2005 | Lee et al. | 134/2 |
| 2005/0172984 A1* | 8/2005 | Schweitzer et al. | 134/26 |
| 2008/0083437 A1* | 4/2008 | Verhaverbeke et al. | 134/58 R |
| 2010/0108093 A1* | 5/2010 | Peng et al. | 134/1.3 |
| 2010/0258142 A1* | 10/2010 | Kawaguchi et al. | 134/1.3 |
| 2010/0326477 A1* | 12/2010 | DeKraker et al. | 134/30 |

* cited by examiner

*Primary Examiner* — Lan Vinh
(74) *Attorney, Agent, or Firm* — Duane Morris LLP

(57) ABSTRACT

A wet chemical processing method and apparatus for use in semiconductor manufacturing and in other applications, is provided. The method and apparatus provide for energizing a processing liquid such as a cleaning or etching liquid using ultrasonic, megasonic or other energy waves or by combining the liquid with a pressurized gas to form a pressurized spray, or using both. The energized, pressurized fluid is directed to a substrate surface using a fluid delivery system and overcomes any surface tensions associated with liquids, solids, or air and enables the processing liquid to completely fill any holes such as contact holes, via holes or trenches, formed on the semiconductor substrate.

16 Claims, 5 Drawing Sheets

METHOD AND SYSTEM FOR ENERGIZED AND PRESSURIZED LIQUIDS FOR CLEANING/ETCHING APPLICATIONS IN SEMICONDUCTOR MANUFACTURING

TECHNICAL FIELD

The disclosure is directed to semiconductor manufacturing methods and systems, and more particularly, to methods and systems for energizing processing fluids and etching and cleaning semiconductor substrates using energized processing fluids.

BACKGROUND

Semiconductor devices are produced and used throughout the world in electronic and various other types of devices. Semiconductor devices are formed on chips, and are often referred to as chips, which include millions of features and components that combine to form an integrated circuit or other semiconductor device. There is a constant push to increase integration levels of semiconductor devices by including more components on a chip of a given size, so that increased functionality can be achieved on each semiconductor device chip. As such, semiconductor device features continue to shrink and there is an ongoing drive to shrink features and components further. One aspect of feature sizes that continue to shrink is the production of high aspect ratio features on or in a substrate.

For example, the lateral dimensions of holes or trenches that extend downwardly into a substrate or into a film or films formed over a substrate, continue to shrink. Advanced processing techniques allow for these holes or trenches with shrinking lateral dimensions to be formed deeper and deeper into substrates or film or films formed above the substrates. As such, the aspect ratio continues to become greater. Practically every substrate upon which semiconductor devices are being formed, undergoes multiple wet processing operations. The wet processing operations include cleaning operations and etching operations. As the aspect ratio of holes or trenches formed on or over the substrate become greater, it becomes increasingly more difficult for the cleaning or etching fluid to extend downward to completely fill the holes or trenches. If the etching or cleaning fluid does not extend to the bottom of the holes or trenches, undesirable residue can remain after cleaning operations and undesirable material intended to be etched, can remain after etching operations. This is due, at least in part, to surface tension of the liquid that is introduced onto the surface as an etching or cleaning fluid, and can also be due to reaction products or by-products.

There is also a solid-air surface tension on the surface of the substrate that can result in voids, i.e. air bubbles, when a substrate is undergoing wet processing. This results in small areas on the substrate that are not reached by the liquid.

One technique for reducing the adverse effects due to liquid surface tension and solid-air surface tension on the surface of the substrate, is the use of a surfactant in wet cleaning. Surfactants are compounds that lower the surface tension of a liquid, the interfacial tension between two liquids, or that between a liquid and a solid. Surfactants may act as detergents, wetting agents, emulsifiers, foaming agents and dispersants. The surfactant is added to the processing liquid and is often useful in overcoming poor wettability. The surfactant assists in having the liquid coat the entire substrate surface and also in penetrating and filling high aspect ratio structures.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

The disclosure provides methods and processing tools for wet processing of semiconductor devices. In some embodiments, the disclosure provides for energizing processing liquids such that the processing liquid overcomes any liquid or solid surface tension effects and the energized processing liquid completely fills all holes and trenches on a semiconductor substrate. In some embodiments, the disclosure provides for mixing the processing liquid with a high-pressure inert or other gas and directing a pressurized spray to the surface of a substrate such that the processing liquid penetrates and completely fills all holes, trenches and the like formed on a semiconductor substrate. The disclosure also provides for controlling the pressure of a wet processing chamber and maintaining the wet processing chamber at a pressure below atmospheric pressure.

As the holes formed in semiconductor substrates or in layers of material disposed over semiconductor substrates, become narrower, higher aspect ratios result. As the aspect ratios become greater, it becomes increasingly more difficult to fill the openings completely with a processing liquid. A number of factors contribute to this problem. Among the factors are the liquid-air surface tension ($F_{la}$), liquid-solid surface tension ($F_{ls}$), and solid-air surface tension ($F_{sa}$). A non-wettable surface is a surface upon which liquid tends to bead up and is often defined as: $F_{la} > F_{ls} - F_{sa} > 0$. A wettable surface is often defined as a surface in which $F_{la} > 0 > F_{ls} - F_{sa}$. In addition to surfaces being generally wettable or non-wettable, there is difficulty in a liquid completely filling a small hole or a trench simply because of the inside gas pressure of the gas within the opening.

In many cases, the processing liquid does not reach the bottom of the opening simply because of the pressure of the gas in the opening. In some cases, the pressure is caused by gasses formed as a result of a reaction between the processing liquid and the substrate or materials on the substrate. The disclosure provides methods including energizing the processing liquid, delivering the liquid as a spray along with a pressurized gas, maintaining a low pressure liquid processing chamber, and combining one or more of the foregoing to treat the processing liquid such that the processing liquid completely fills the openings. The methods and apparatuses of the invention apply both to liquids used for cleaning, etching, and other processing purposes in the semiconductor manufacturing industry and any industry in which wet processing takes place and it is desirable for the wet processing liquid to completely fill various types of openings, trenches, and the like.

Figure 1A:
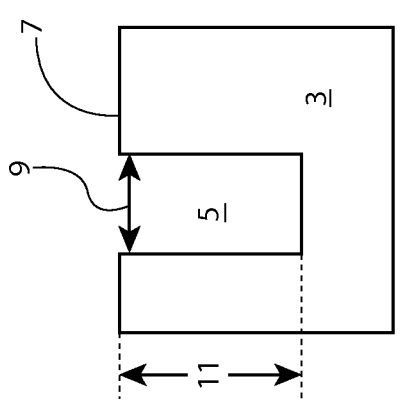
FIGS. 1A-1C are cross-sectional views showing a sequence of liquid infiltration into an opening in a substrate.
Figure 1B:
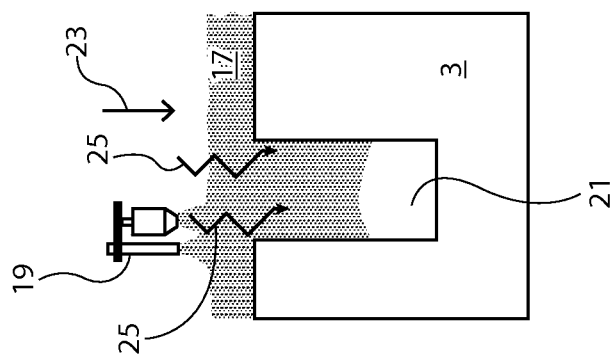
Figure 1C:
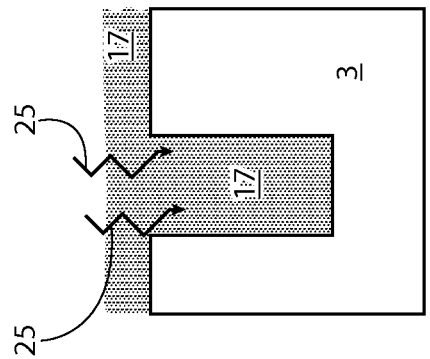

FIGS. 1A-1C are cross-sectional views showing a progression of instances as a processing liquid completely fills an opening in a substrate according to the disclosure.

FIG. 1A shows an opening formed in a substrate. Substrate 3 is a bulk substrate, e.g. a semiconductor wafer in some embodiments and in some embodiments, substrate 3 is a silicon or silicon germanium substrate but other substrates are used in other embodiments. In other embodiments, substrate 3 is a layer or layers of material formed on a bulk substrate such as a semiconductor wafer. Opening 5 extends downwardly from surface 7 of substrate 3 and includes width 9 and depth 11. The aspect ratio of opening 5 is defined by depth 11/width 9. While opening 5 is formed to extend into substrate 3 in the illustrated embodiment, it should be understood that the disclosure finds application in any openings formed in and through various layers or composite layers formed on or over a semiconductor or other substrate. In some embodiments, opening 5 is formed in a dielectric layer, in other embodiments opening 5 is formed in a conductive layer and in another embodiment opening 5 is formed in a semiconductor layer or layers. In other embodiments, opening 5 extends through one or more layers and terminates in another layer or a bulk substrate. FIGS. 1A-1C represent a progression of instances during the process of filling an opening in a semiconductor device in various embodiments. FIG. 1A is a cross-sectional view and opening 5 may be a contact, via, trench or various other openings in various embodiments. As semiconductor processing technology advances and device features become smaller, the aspect ratio of opening 5 increases and in some embodiments, width 9 may be as small as 60 mm in some embodiments. In other embodiments, width 9 is less than 60 mm.

FIG. 1B shows processing liquid 17 introduced to substrate 3 and in the process of filling opening 5. Processing liquid 17 is delivered by fluid delivery system 19 (not shown to scale) and is in the process of completely filling opening 5 shown in FIG. 1A. At the instant of FIG. 1B, void 21 still exists but FIG. 1C shows that processing liquid 17 completely fills former opening 5 shown in FIG. 1A.

Still referring to FIG. 1B, processing liquid 17 is delivered to substrate 3 using various methods in various embodiments. Substrate 3 is disposed in various wet processing chambers in various embodiments. In some embodiments, substrate 3 is disposed in a single-wafer processing chamber and in other embodiments, substrate 3 is one of multiple substrates disposed in a batch processing chamber. Substrate 3 is oriented in various positions in various embodiments and the processing chamber includes one or multiple receiving members capable of receiving therein or thereon, one or multiple substrates. Processing liquid 17 is a cleaning fluid in some embodiments and processing liquid 17 is an etching liquid in other embodiments and processing liquid 17 is used for various other functions in other embodiments. Examples of processing liquids include NH4OH, KOH, TMAH (tetramethylammonium hydroxide), NH4OH/H2O2/H2O, NH4OH/H2O, HCl/H2O2/H2O, HCl/H2O, H2SO4/H2O2, Hf/H2O, Hf/H2O2/H2O, Hf/NH4F/H2O, HNO3/H2O HNO3/HCl/H2O, and H3PO4/H2O. The preceding list of chemicals is intended to be exemplary only, and not limiting.

Referring still to FIG. 1B, fluid delivery system 19 represents various types of fluid delivery systems in various embodiments as will be discussed below. Fluid delivery system 19 is coupled to any of various liquid sources. Jagged arrows 25 represent energy applied to processing liquid 17 in fluid delivery system 19. In some embodiments, fluid delivery system 19 utilizes a transducer that energizes the processing liquid. In some embodiments, as will be discussed later, fluid delivery system 19 utilizes a pressurized gas to deliver an energized liquid with a high spray force. Arrows 23 indicate the pressurized gas combined with liquid as will be shown in further detail in FIG. 5. The energized nature of the liquid along with the additional pressurized gas, enables processing liquid 17 to overcome any liquid-air surface tensions, liquid-solid surface tensions and solid-air surface tensions and completely fill former opening 5 as shown in FIG. 1C.

Figure 2:
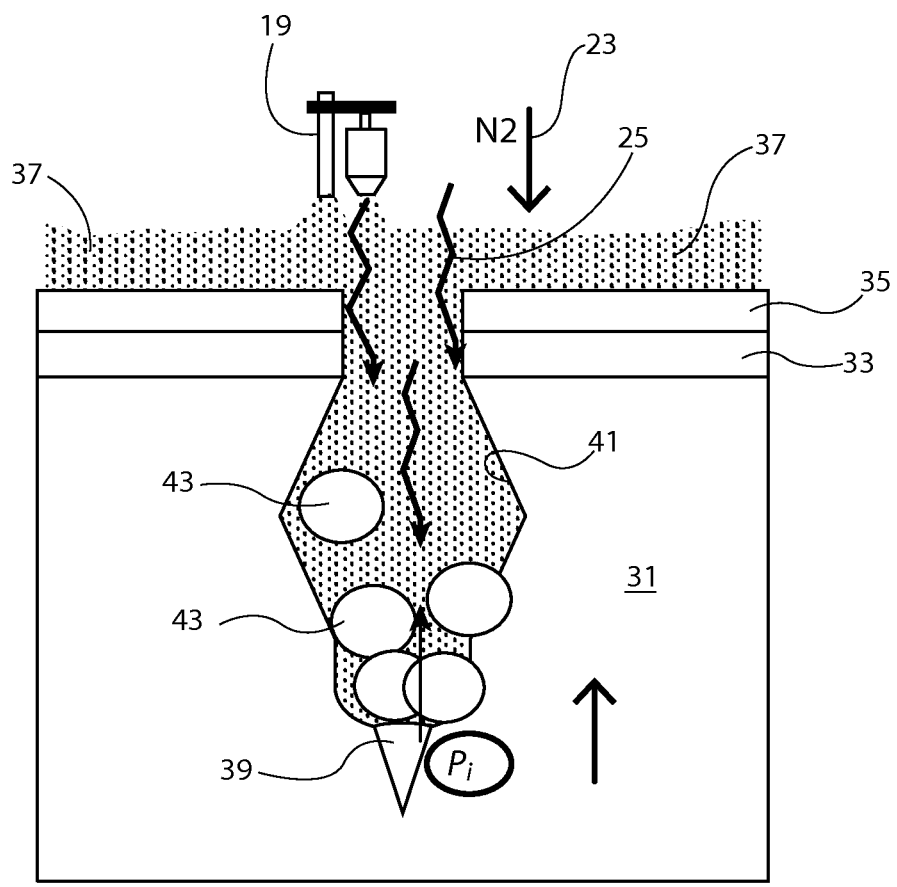
FIG. 2 shows an energized liquid filling an opening in a substrate and further shows the release of vapor from the opening.

FIG. 2 shows another embodiment in which opening 41 is formed within substrate 31. More particularly, opening 41 is formed and extends through material layers 33 and 35 formed over substrate 31. Material layers 33 and 35 are various different types of layers in various embodiments and substrate 31 represents a bulk substrate or a material layer formed over a bulk substrate, in various embodiments. FIG. 2 also includes fluid delivery system 19 which delivers energized processing liquid 37 from a liquid source (not shown) in some embodiments and fluid delivery system 19 delivers a gas-liquid spray in other embodiments. Jagged arrows 25 indicate energy delivered to energized processing liquid 37. FIG. 2 represents an intermediate step of the process in which energized processing fluid 37 completely fills opening 41. At the instant of time depicted in FIG. 2, void area 39 has yet to be filled with energized processing liquid 37. The energy applied to energized processing liquid 37 is effective in overcoming any vapor pressures and causing bubbles 43 to be liberated from opening 41 and enabling energized processing liquid 37 to completely fill opening 41. The energized liquid eliminates or overcomes pressure effects of nano-sized holes. In some embodiments, the chemicals of energized processing liquid 37 react with the material of substrate 31 to form gas within opening 41 and which produces bubbles 43. In some embodiments such as silicon etching using $NH_4OH$, KOH, or TMAH, the reaction of the chemical with silicon produces $H_2$ gas. In some embodiments, bubbles 43 are hydrogen bubbles but other bubbles are released in other embodiments and bubbles 43 are produced as a result of various other mechanisms in other embodiments.

Figure 3:
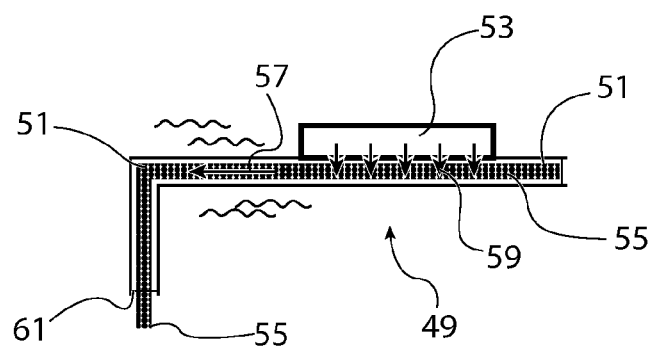
FIG. 3 shows a transducer energizing a liquid in a liquid delivery system.

FIG. 3 shows a liquid delivery system according to various embodiments of the disclosure. Liquid delivery system 49 includes processing liquid 55 flowing through liquid delivery member 51 in some embodiments. Liquid delivery member 51 may be a pipe, tube, conduit or other member that delivers processing liquid 55 along flow direction 57. Processing liquid 55 exits liquid delivery member 51 at delivery port 61 and is directed to a substrate in some embodiments. Processing liquid 55 is delivered by delivery port 61 to various other locations in a wet processing chamber in other embodiments.

Transducer 53 energizes processing liquid 55. Transducer 53 is positioned in contact with liquid delivery member 51 and may be in conterminous relationship with liquid delivery member 51. In some embodiments, transducer 53 is disposed along an outer wall of liquid delivery member 51 which is a pipe and transducer 53 completely surrounds the outer walls of liquid delivery member 51 in some embodiments. Arrows 59 represent energy delivered to processing liquid 55. Processing liquid 55 is any of various wet chemical processing liquids such as cleaning liquids and etching liquids including the examples provided above.

In some embodiments, transducer 53 is an ultrasonic transducer that directs ultrasonic waves into processing liquid 55 such as indicated by arrows 59. Ultrasonics is the application of ultrasound and involves radiation having waves of a frequency greater than about 2-20 kilohertz (kHz). Ultrasound is a cyclic sound pressure wave with a frequency greater than the upper limit of the human hearing range. Various frequencies are used in various embodiments. Processing liquid 55 is also pressurized in various embodiments and may be delivered at a pressure of about 1 MPa to about 5 MPa in some embodiments but other pressures are used in other embodiments. The processing liquid 55 energized by ultrasonic waves is delivered at delivery port 61 and is able to completely fill holes in semiconductor substrates being processed, such as openings 5 and 41, shown previously.

In other embodiments, transducer 53 delivers megasonic energy to processing liquid 55. Megasonic energy is another type of acoustic energy delivered by transducer 53 to processing liquid 55 as indicated by arrows 59. Megasonic sound waves typically include a higher frequency than ultrasonic waves which generally include a frequency of about 2-200 kHz. Megasonic sound waves generally include a higher frequency, typically about 0.8-2 MHz. The application of megasonic sound waves to processing liquid 55 energizes processing liquid 55. Processing liquid 55 may also be pressurized and delivered at a pressure of about 1 MPa to about 5 MPa in the megasonic energy embodiment. The processing liquid 55 energized by megasonic waves is delivered at delivery port 61 and is able to completely fill holes in semiconductor substrates such as openings 5 and 41, shown previously.

In some embodiments, transducer 53 delivers both ultrasonic and megasonic energy waves and processing liquid 55 is treated with both in a simultaneous or sequential manner.

Figure 4A:
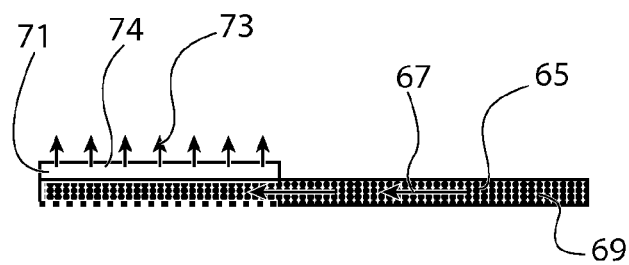
FIGS. 4A and 4B show piezoelectric energy applied to a liquid in a liquid delivery system.
Figure 4B:
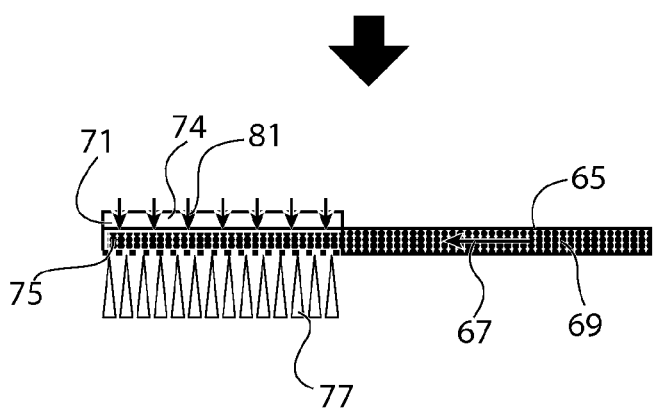

FIGS. 4A and 4B are two illustrations in which a piezoelectric transducer is used to produce an inverse piezoelectric effect that produces pressurized liquid. The piezoelectric effect is the linear electromechanical interaction between the mechanical and the electrical state in various crystalline materials with no inversion symmetry. The inverse piezoelectric effect produces mechanical strain resulting from an applied electric field. Various different types of piezoelectric crystals are used in piezoelectric devices in various embodiments.

In FIG. 4A, liquid delivery member 65 delivers processing liquid 69 along flow direction 67. Liquid delivery member 65 illustrated in FIGS. 4A and 4B is coupled to various liquid sources in various embodiments. Liquid delivery member 65 may be a pipe, tube, conduit, or other member for liquid delivery. Transducer 71 is a piezoelectric transducer that utilizes an inverse piezoelectric effect to produce mechanical strain resulting from an applied electric field and the mechanical strain is in the form of ultrasonic waves in some embodiments. Arrows 73 represent that plate 74 of transducer 71 is in an upper position.

FIG. 4B shows the delivery of liquid 77 from multiple liquid delivery ports in head 75. Arrows 81 indicate plate 74 in down position: With plate 74 in the down position, processing liquid 69 is pressurized and directed downward to produce liquid 77. Various other configurations are used for transducer 71 and head 75 in various embodiments. Liquid 77 is dispensed into a processing chamber and is directed to one or more substrates in the processing chamber, in some embodiments. Liquid 77 is an energized liquid. In some embodiments, the inverse piezoelectric effect may be produced using a transducer oriented such as transducer 53 shown in FIG. 3.

Figure 5:
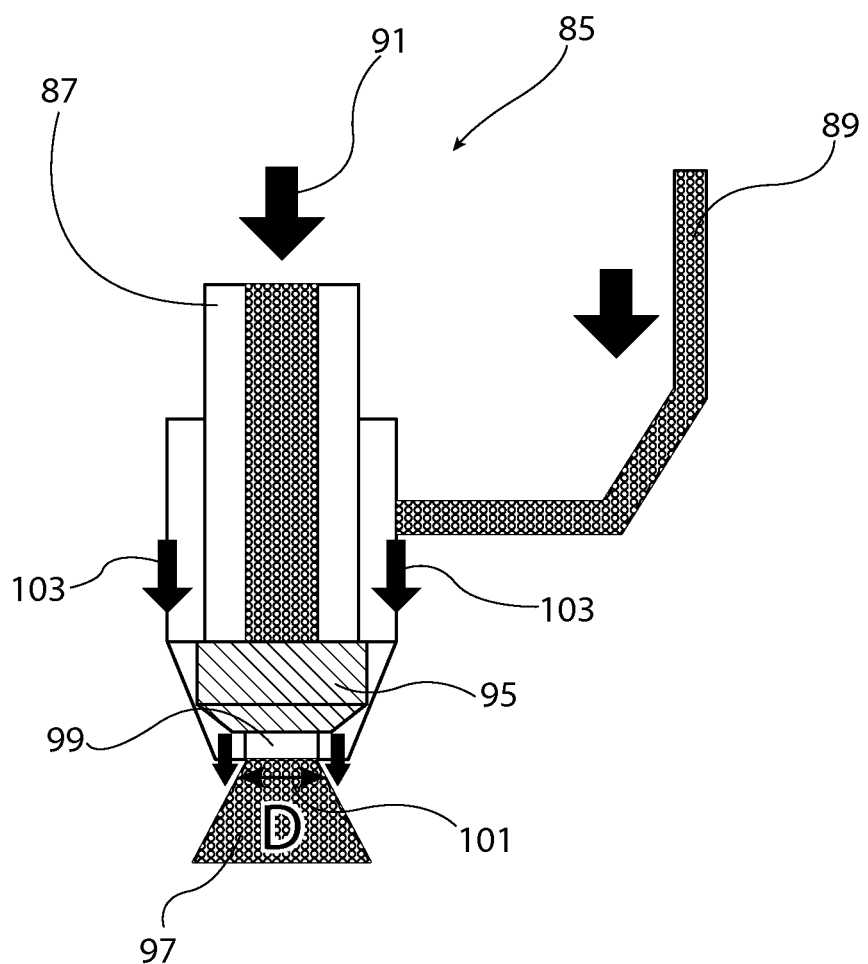
FIG. 5 shows a pressurized gas being combined with a liquid to deliver an atomizing spray.

FIG. 5 shows fluid delivery device 85. Fluid delivery device 85 combines liquid flowing in liquid delivery member 87 with gas flowing in gas delivery member 89. Liquid flow arrow 91 indicates the delivery of liquid from a liquid source and the direction of flow of liquid within liquid delivery member 87 of fluid delivery device 85. Various liquids including the aforementioned processing liquids are used in various embodiments. In some embodiments, the liquid indicated by liquid flow arrow 91 is a processing liquid that has been previously energized using one of the previously described embodiments. Mixing head 95 mixes gas from gas delivery member 89 indicated by arrows 103 with liquid from liquid delivery member 87 and produces a liquid-gas mixture, and fluid spray 97 that exits through nozzle 99. The liquid within liquid delivery member 87 may be any of the aforementioned processing liquids and the gas in gas delivery member 89 may be an inert or other gas. In various embodiments, the gas may be at least one of $N_2$, $O_2$, He, Ar, $CO_2$, CO, $H_2$ and Ne and is a pressurized gas in some embodiments. In one embodiment, the liquid flow rate is about 50-500 ml/min but other flow rates are used in other embodiments and gas flow of the gas through gas delivery member 89 may range from about 5 liters per minute to about 100 liters per minute in various embodiments although other flow rates are used in other embodiments.

The pressurized gas flowing through gas delivery member 89 and combined in mixing head 95 produces fluid spray 97 which may be an atomizing fluid in one embodiment or various other spray types in other embodiments. Fluid spray 97 exhibits a high spray force which is greater than 1 atmosphere in some embodiments. Various droplet sizes are produced in various embodiments. The high spray force enables the liquid, initially in the form of droplets, to fill any openings on the surface of the substrate being processed. Diameter 101 of nozzle 99 varies from 1 mm to about 10 mm in various embodiments but other diameters are used in other embodiments. Nozzle 99 is designed and includes a diameter 101 capable of producing fluid spray 97 as described above. Fluid spray 97 is delivered within a wet processing chamber and may be delivered directly to a receiving member capable of retaining one or more substrates, in various embodiments.

Figure 6:
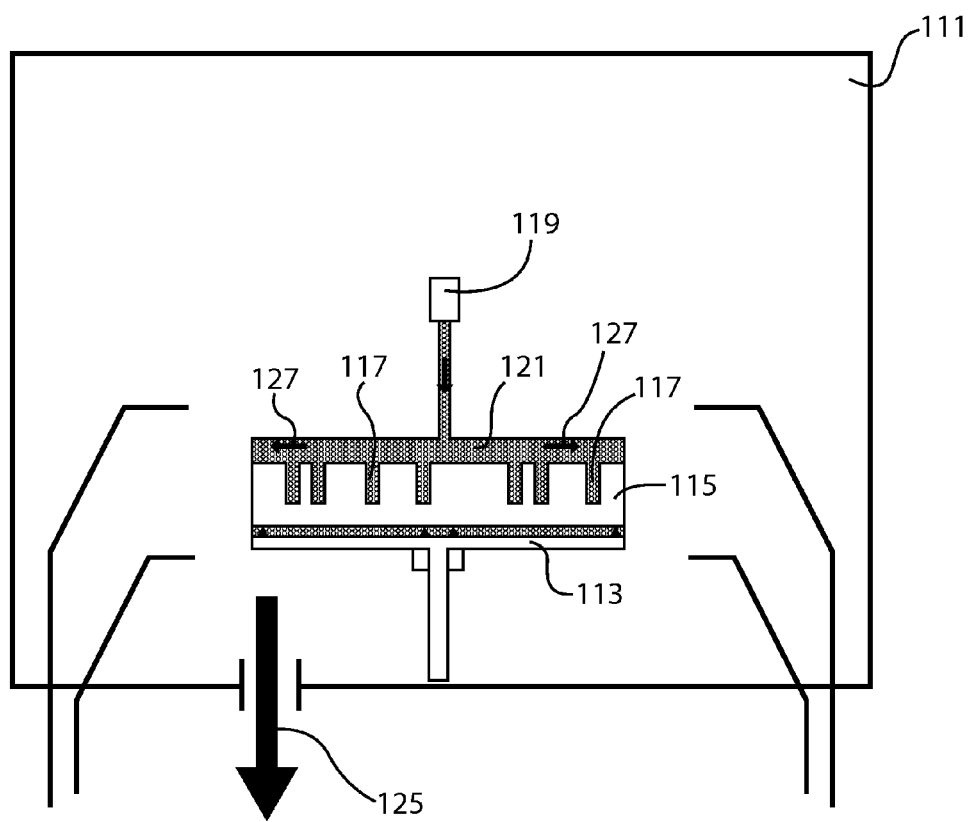
FIG. 6 shows a liquid processing chamber with a substrate undergoing processing by an energized liquid.

FIG. 6 is a processing chamber such as used in various embodiments of the disclosure. Wet processing chamber 111 is a pressure controlled chamber in some embodiments and in some embodiments, the pressure within wet processing chamber 111 is lower than 1 atmosphere. In some embodiments, pressure within wet processing chamber 111 is at ambient pressure and in some embodiments, pressure maintained within wet processing chamber 111 is greater than 1 atmosphere. Various pressure controllers are used in various embodiments. In some embodiments, wet processing chamber 111 is not a pressurized chamber. Wet processing chamber 111 includes substrate retaining member 113. Substrate retaining member 113 retains substrate 115 that includes various openings 117. Fluid delivery system 119 may be any of the previously described fluid delivery systems and delivers processing liquid 121 which may be energized, delivered as a pressurized spray, or both. Processing liquid 121 completely fills openings 117. Although depicted as being inside wet processing chamber 111 in FIG. 6, in other embodiments, fluid delivery system 119 is disposed outside of wet processing chamber 111. Wet processing chamber 111 takes on various sizes and various embodiments. Exhaust flow 125 indicates gas being exhausted from wet processing chamber 111. In some embodiments, substrate retaining member 113 is capable of rotation and processing liquid 121 flows outwardly, as indicated by arrows 127, due to centrifugal force. In some embodiments, substrate 115 is retained in a stationary manner during processing. In some embodiments, wet processing chamber 111 includes multiple substrates 115 and substrate retaining members 113 Wet processing chamber 111 represents just one example and the methods and fluid delivery systems describing the disclosure are used to deliver energized and/or pressurized liquids to various other types of wet processing chambers in other embodiments.

According to one aspect, a method for wet processing a substrate is provided. The method comprises: providing a liquid delivery system and a processing chamber with at least one substrate receiving member therein; delivering a processing liquid through the liquid delivery system to the processing chamber; and energizing the processing liquid while delivering the processing liquid through the liquid delivery system.

According to another aspect, a method for wet processing a substrate is provided. The method comprises: providing a fluid delivery system and a substrate processing chamber with a receiving member capable of receiving therein at least one substrate for processing; delivering a processing liquid through the fluid delivery system to the substrate processing chamber; and combining a pressurized gas with the processing liquid during the delivering thereby causing a spray of the processing liquid to be delivered to the receiving member in the substrate processing chamber.

According to yet another aspect, a system for wet processing a semiconductor substrate is provided. The system comprises: a wet processing chamber with a substrate receiving member capable of receiving one or more substrates for processing therein; a fluid delivery system that delivers at least a processing liquid from a source to the wet processing chamber; and an energizing unit that energizes the processing liquid as it travels through the liquid delivery system.

The word "exemplary" is used herein to mean "serving as an example or illustration". Any aspect or design described herein as "exemplary" is not necessarily to be construed as preferred or advantageous over other aspects or designs.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for wet processing a substrate, said method comprising:
    providing a liquid delivery system and a processing chamber with at least one substrate receiving member therein;
    delivering a processing liquid through said liquid delivery system to said processing chamber; and
    energizing said processing liquid in said liquid delivery system at a location upstream from a dispense port of said liquid delivery system, while delivering said processing liquid through said liquid delivery system,
    wherein said energizing said processing liquid comprises treating said processing liquid with energy waves of different frequencies, in a sequential manner, said energy waves of different frequencies comprising megasonic energy waves and ultrasonic energy waves.

2. The method as in claim 1, wherein said energizing said processing liquid comprises treating said processing liquid with ultrasonic energy waves.

3. The method as in claim 1, further comprising controlling pressure in said processing chamber to a pressure below ambient pressure.

4. The method as in claim 1, wherein said energizing said processing liquid comprises treating said processing liquid with a piezoelectric transducer.

5. The method as in claim 1, wherein said processing liquid is one of an etching liquid and a cleaning liquid and further comprising providing a substrate in said substrate processing chamber and one of etching and cleaning said substrate.

6. The method as in claim 1, wherein said processing liquid comprises one of $NH_4OH$, $KOH$ and TMAH (tetramethylammonium hydroxide).

7. The method as in claim 1, wherein said processing liquid comprises at least one of $NH_4OH/H_2O_2/H_2O$, $NH_4OH/H_2O$, $HCl/H_2O_2/H_2O$, $HCl/H_2O$, $H_2SO_4/H_2O_2$, $Hf/H_2O$, $Hf/H_2O_2/H_2O$, $Hf/NH_4F/H_2O$, $HNO_3/H_2O$ $HNO_3/HCl/H_2O$, tetramethylammonium hydroxide and $H_3PO_4/H_2O$.

8. A method for wet processing a substrate, said method comprising:
    providing a fluid delivery system and a substrate processing chamber with a receiving member capable of receiving therein at least one substrate for processing;
    delivering a processing liquid through said fluid delivery system to said substrate processing chamber;
    combining a pressurized gas with said processing liquid during said delivering thereby causing a spray of said processing liquid to be delivered to said receiving member in said substrate processing chamber; and
    energizing said processing liquid in said fluid delivery system using one of ultrasonic radiation waves and megasonic radiation waves,
    wherein said delivering a processing liquid includes said processing liquid having a flow rate of about 50-500 ml/minute and wherein said combining a pressurized gas comprises combining an inert gas having a flow rate of about 5-100 liters/minute with said processing liquid, and said spray is delivered to said substrate through a dispense port having a diameter of about 1 mm to about 10 mm and with a spray force greater than about 1 atmosphere.

9. The method as in claim 8, wherein said processing liquid comprises one of $NH_4OH/H_2O_2/H_2O$, $NH_4OH/H_2O$, $HCl/H_2O_2/H_2O$, $HCl/H_2O$, $H_2SO_4/H_2O_2$, $Hf/H_2O$, $Hf/H_2O_2/H_2O$, $Hf/NH_4F/H_2O$, $HNO_3/H_2O$ $HNO_3/HCl/H_2O$, tetramethylammonium hydroxide and $H_3PO_4/H_2O$ and wherein said gas comprises at least one of $N_2$, $0_2$, He, Ar, $CO_2$, CO, $H_2$ and Ne.

10. The method as in claim 8, further comprising disposing at least one substrate in said receiving member and further comprising treating said substrate with said spray of said processing liquid, said treating comprising at least one of etching and cleaning, and wherein said fluid delivery system includes a pipe and said energizing includes energizing using an energy unit coupled to and conterminously surrounding said pipe.

11. A system for wet processing a semiconductor substrate, said system comprising:

a wet processing chamber with a substrate receiving member capable of receiving one or more substrates for processing therein;

a fluid delivery system that delivers at least a processing liquid from a source to said wet processing chamber; and an energizing unit that energizes said processing liquid as it travels through said fluid delivery system at a location upstream from a dispense port of said fluid delivery system such that a pipe of said fluid delivery system extends between said energizing unit and said dispense port, and a gas delivery system that delivers pressurized gas and combines said pressurized gas to said processing liquid in said fluid delivery system such that said fluid delivery system delivers a spray of said processing liquid to said one or more substrates in said wet processing chamber, wherein said system is configured to deliver said processing liquid and said pressurized gas directly onto a surface of said substrate being processed and on a same side as said energizing unit is disposed.

12. The system as in claim 11, wherein said energizing unit produces ultrasonic waves.

13. The system as in claim 11, wherein said energizing unit produces megasonic waves.

14. The system as in claim 11, wherein said energizing unit comprises a piezoelectric transducer.

15. The system as in claim 11, wherein said energizing unit is coupled to and conterminously surrounds at least a section of said pipe.

16. The system as in claim 11, wherein said energizing unit produces one of ultrasonic waves and megasonic waves and further comprising a pressure controller that controls pressure in said chamber and maintains said process chamber at a pressure less than ambient pressure.

* * * * *